(12) United States Patent
Fujiwara et al.

(10) Patent No.: US 11,742,044 B2
(45) Date of Patent: Aug. 29, 2023

(54) MEMORY BUILT-IN SELF-TEST WITH ADJUSTABLE PAUSE TIME

(71) Applicant: Micron Technology, Inc., Boise, ID (US)

(72) Inventors: Yoshinori Fujiwara, Boise, ID (US); Daniel S. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 17/411,206

(22) Filed: Aug. 25, 2021

(65) Prior Publication Data

US 2023/0069351 A1    Mar. 2, 2023

(51) Int. Cl.
| | |
|---|---|
| *G11C 29/36* | (2006.01) |
| *G11C 29/12* | (2006.01) |
| *G11C 29/44* | (2006.01) |
| *G11C 29/46* | (2006.01) |

(52) U.S. Cl.
CPC ........ *G11C 29/36* (2013.01); *G11C 29/12015* (2013.01); *G11C 29/4401* (2013.01); *G11C 29/46* (2013.01); *G11C 2029/3602* (2013.01)

(58) Field of Classification Search
CPC . G11C 2029/0409; G11C 29/02; G11C 11/41; G11C 29/026; G11C 29/028; G11C 7/12; G11C 29/50012; G11C 7/1006; G11C 7/1078; G11C 7/109; G11C 7/1093; G11C 7/222; G11C 8/06; G11C 8/18; G11C 29/36; G11C 29/50; G11C 2029/3602; G11C 29/38; G11C 7/22; G11C 2029/1806; G11C 2029/2602; G11C 2029/5602; G11C 29/023; G11C 29/08; G11C 29/12; G11C 29/14; G11C 29/26; G11C 29/56; G11C 29/56004; G11C 17/16; G11C 17/18; G11C 2029/0405; G11C 2029/0407; G11C 2029/4402; G11C 29/12015; G11C 29/16; G11C 29/4401; G11C 7/04; G11C 8/08
USPC ......... 365/200, 205, 154, 201, 207
See application file for complete search history.

(56) References Cited

FOREIGN PATENT DOCUMENTS

CN    103839590 A  *  6/2014

* cited by examiner

*Primary Examiner* — Thong Q Le
(74) *Attorney, Agent, or Firm* — Perkins Coie LLP

(57) ABSTRACT

An apparatus with a memory array having a plurality of memory cells. The apparatus also including a memory built-in self-test circuit to test the memory array. The memory built-in self-test circuit includes one or more processing devices to write a data pattern to one or more memory cells to be tested in the memory array, pause for a time period corresponding to a predetermined pause time setting, and read the written data pattern from the one or more memory cells after the time period has elapsed. The predetermined pause time setting is automatically adjusted based on memory device conditions, which can include the temperature of the apparatus.

20 Claims, 4 Drawing Sheets

MEMORY BUILT-IN SELF-TEST WITH ADJUSTABLE PAUSE TIME

TECHNICAL FIELD

The present disclosure generally relates to built-in self-test circuits, and more particularly, to a built-in self-test circuit for a memory array having an adjustable pause time between write operations and read operations.

BACKGROUND

As memory circuits in an apparatus get more complex and/or dense, there can be limited access to the embedded memory arrays. In such cases, memory testing techniques that employ testers that are external to embedded memory array may not be practical and/or provide inadequate results. Built-in self-test (BIST) circuits can be used for manufacturing and/or production testing of embedded memory arrays. In addition, memory BIST (MBIST) circuits can be used for diagnostics and debugging during normal and/or power on operation. An advantage of MBIST circuits is that the circuits can shorten test times because the self-test circuit is incorporated within the memory control logic. In addition, because the MBIST procedure can be run at the operating speed, the MBIST circuit may detect errors that occur at the operating speed of the embedded memory array. MBIST can include Pass/Fail determination on the memory being tested and can also include (or coordinate with) circuits that perform repairs based on the Pass/Fail determination. The repair circuit can include, for example, circuits that disable failed memory and place into operation redundant memory cells to replace the failed memory.

An MBIST circuit writes test data to the memory being tested and then reads back the data from the memory cells. Standards organizations such as JEDEC have added MBIST protocols to memory module specifications, such as, for example, the DDR4 and DDR5 memory module specifications. Depending on the memory density and/or the standard organization, there can be time limits to perform the write/read test data pattern of the MBIST procedure (e.g., the JEDEC standard imposes a 10-second limit for DDR4 memory modules with a 16 GB density—other memory densities and/or organizations can have different limits). Accordingly, an MBIST procedure should be performed as fast as possible while maintaining accuracy with respect to detecting memory faults. In conventional MBIST circuits, the read back can be performed immediately after the write (zero pause time) or after a fixed pause (or delay) time. However, such conventional MBIST circuits with fixed or zero pause times have inaccuracies with respect to memory fault determinations and/or are inefficient with respect to the time required for the test.

For the reasons stated above, and for other reasons stated below which will become apparent to those skilled in the art upon reading and understanding the present specification, there is a need in the art for a more precise MBIST circuits that are also efficient.

DETAILED DESCRIPTION

Figure 1:
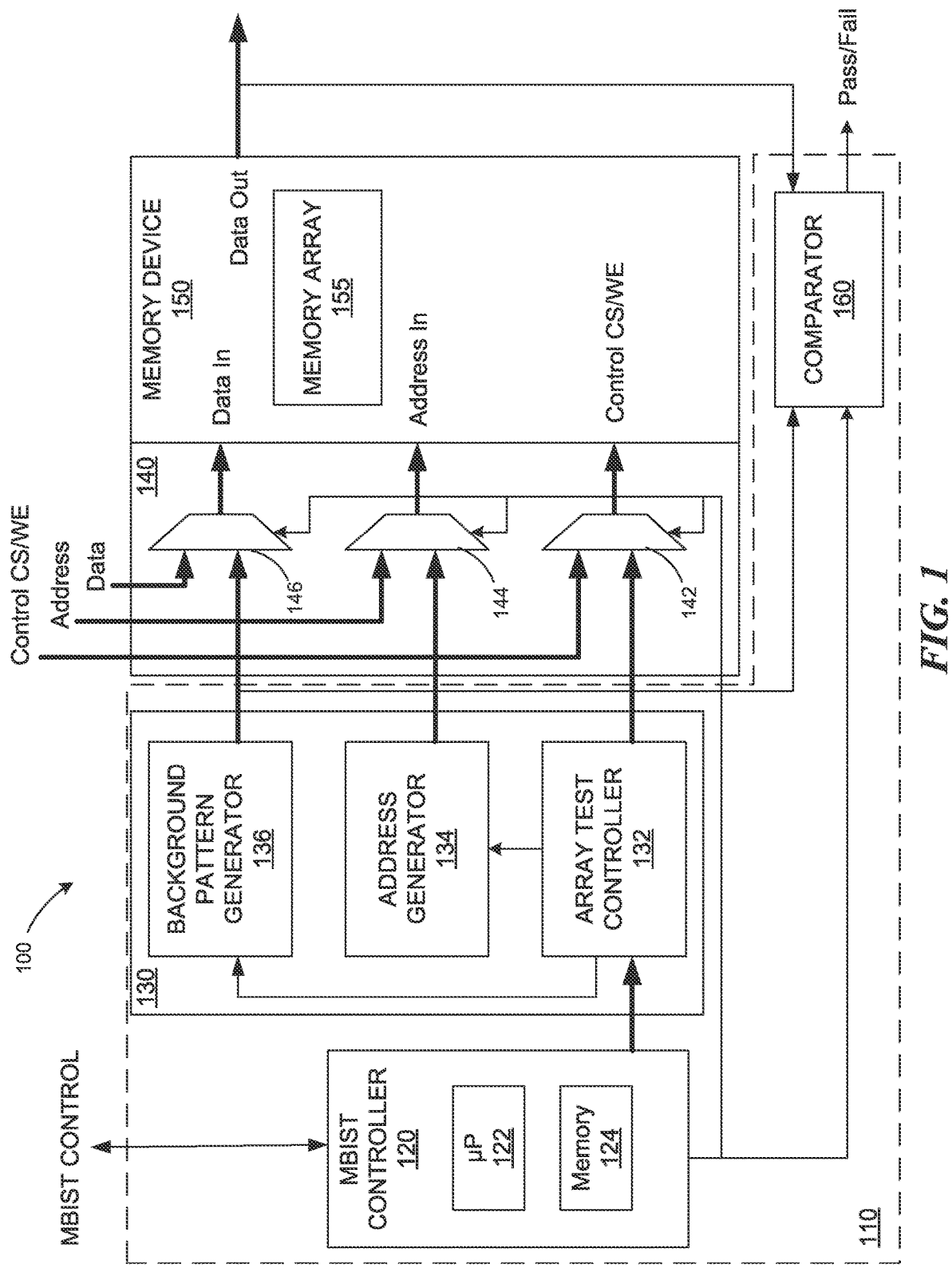
FIG. 1 illustrates a memory built-in self-test circuit in accordance with an embodiment of the present disclosure.

Apparatuses in accordance with embodiments of the present disclosure can include memory storage devices and associated control circuits. The memory storage device can have memory regions (e.g., NAND memory regions), logic gates, timers, counters, latches, shift registers, microcontrollers, microprocessors, field programmable gate arrays (FPGAs), sensors, and/or other integrated circuitry. The apparatuses can also include other circuit components, such as multiplexers, decoders, buffers, read/write drivers, address registers, data out/data in registers, etc., for accessing and/or processing data and other functionality, such as, for example, programming memory cells of a memory region and/or communicating with controllers and/or host devices. The memory device can include dynamic random access memory (DRAM) (including, e.g., DDR3, DDR4, DDR5), 3-D memory including high bandwidth memory (HBM) (having, e.g., DRAM, NOR, PCM, RRAM, MRAM), read only memory (ROM); erasable programmable ROM (EPROM); electrically erasable programmable ROM (EEPROM); ferroelectric and other storage media, including volatile storage media.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Embodiments of the present technology are directed to an apparatus with a memory array having a plurality of memory cells. The apparatus can also include a memory built-in self-test circuit to test the memory array. The memory built-in self-test circuit includes one or more processing devices to write a data pattern to one or more memory cells to be tested in the memory array, pause for a time period corresponding to a predetermined pause time setting, and read the written data pattern from the one or more memory cells after the time period has elapsed. The predetermined pause time setting is automatically adjusted based on memory device conditions, which, in some embodiments, can include the temperature of the apparatus. Another embodiment of the present disclosure is directed to a method that includes writing a data pattern to one or more memory cells in a memory array to be tested. The memory array can include a plurality of memory cells. The method also includes automatically adjusting a predetermined pause time setting and pausing for a time period corresponding to the predetermined pause time setting. The method further includes reading the written data pattern from the one or more memory cells after the time period has elapsed.

A simplified overview of an apparatus 100 with an MBIST circuit and a memory module is illustrated in FIG. 1. The MBIST circuit 110 can include an MBIST controller 120 that is connected to one or more memory array test circuits 130 which can then be connected to one or more memory devices 150 via a respective multiplexer circuit 140 (also referred to in the art as a test collar). The memory device 150 can include one or more memory arrays 155 that can be tested by the MBIST circuit 110. Each memory array 155 can include a plurality of memory cells arranged in a grid pattern with rows and column as is known in the art. In some embodiments, the MBIST controller 120, the memory array test circuit 130, and/or the test collar 140 can be incorporated into a single integrated circuit. In some embodiments, the MBIST controller 120, the memory array test circuit 130, and/or the test collar 140 can be disposed on a peripheral region of the memory device 150. The peripheral region can include the control logic for the memory device 150 and can be located adjacent to and/or under the memory array 155, depending on the configuration of the memory device 150. In some embodiments, the MBIST controller 120, the memory array test circuit 130, and/or the test collar 140 can be disposed on a semiconductor substrate that is separate from that of the memory device 150.

In some embodiments, the MBIST controller 120 can receive and decode instructions (e.g., from control logic of the memory device 150 and/or from an external tester, host computer, and/or processor) for performing memory test operations on one or more memory arrays of one or more memory modules. In some embodiments, the MBIST controller 120 provides commands for performing the memory test operations (also referred to herein as MBIST procedure) to the memory array test circuit 130. In some embodiments, the MBIST controller 120 can provide instructions for repair and/or isolation of memory cells that have failed the MBIST procedure. In some embodiments, the MBIST controller 120 can include the logic to initiate the MBIST procedure rather than receiving the initiation commands from another source. In some embodiments, the MBIST controller 120 can be a hard-wired circuit or a combination of a hard-wired circuit and a processor-based circuit. For example, in some embodiments, the MBIST controller 120 can include a microprocessor 122 for executing at least a portion of the instructions for an MBIST procedure, such as, for example, sending programming instructions to the memory array test circuit 130. The MBIST controller 120 can also include a controller memory 124 to store, for example, one or more microcodes that provide the programming instructions for testing one or more memory arrays such as, for example, memory array 155. Based on the microcodes, the appropriate commands for performing the MBIST procedure can sent to the memory array test circuit 130. In some embodiments, the controller memory 124 can be a ROM and/or SRAM. In some embodiments, the controller memory 124 can be DRAM and the microcodes be loaded into the controller memory 124 as part of, for example, a power-on procedure.

In some embodiments, the controller memory 124 (and/or another memory location) can store microcodes for one or more memory test sequences. The microcodes represent microprograms having instructions for testing one or more addresses using one or more memory test algorithms (e.g., the algorithms discussed above). The microcodes are predefined and, in some embodiments, can be modified. In some embodiments, during a memory test, a set of one or more microcodes can be transmitted from the MBIST controller 120 to the memory array test circuit 130 for execution by the memory array test circuit 130, which performs the test operations in accordance with the microcodes.

In some embodiments, the memory array test circuit 130 can include an array test controller 132 to generate proper test control signals can correspond to the MBIST procedure for testing the memory array 155 of the memory device 150. The generation of the test control signals output from the array test controller 132 can be based on the commands received from the MBIST controller 120. In some embodiments, the array test controller 132 can be a finite state machine (FSM). The array test controller 132 is also referred to herein as FSM 132. However, embodiments of the present disclosure are not limited to finite state machines and other types of array test controllers can be used to perform the functions of array test controller 132. The memory array test circuit 130 can also include an address generator 134 that provides the memory address sequences for the MBIST procedure, and a background pattern generator 136 that generates the test data patterns to be sent to the memory array 155 during the testing time period. In some embodiments, the FSM 132 provides the control instructions (e.g., column select and/or word line enable signals) to the memory device 150 for writing to/reading from the memory cell(s) of memory array 155 to be tested. In some embodiments, the FSM 132 can provide the instructions for the address generator 134 and/or the background pattern generator 136 for performing the respective address generation and pattern generation functions. In some embodiments, the memory array test circuit 130 can include one or more processors and/or memory (e.g., processor device(s) in the FMS 132, the address generator 134, and/or the background pattern generator 136) to perform the respective functions of the FMS 132, the address generator 134, and/or the background pattern generator 136. In some embodiments, the processor 122 can perform the functions of the FMS 132, the address generator 134, and/or the background pattern generator 136.

In some embodiments, the address generator 134 can generate the address range of the memory locations to be tested (e.g., addresses corresponding to the entire memory array, a plane, a block, a page, a line, etc.) and/or the order in which the memory locations are to be tested (e.g., ascending, descending, or some other order). For example, in some embodiments, the address range generated for each write/pause/read operation corresponds to a block of memory cells to be tested in the memory array 155. As one block is tested, the addresses for the next block is generated until the memory array(s) are tested. Based on the generated address range, the address generator can select the column and/or row of the one or more memory cells to be tested of memory array 155.

In some embodiments, the test data pattern(s) generated by background pattern generator 136 can be based on a testing algorithm such as, for example, a checkboard algorithm, zero-one algorithm, galloping pattern algorithm, walking pattern algorithm, a sliding (galloping) diagonal algorithm, a butterfly algorithm, a moving inversion algorithm, a surround disturb algorithm, one or more of the March algorithms known in the art, and/or a modified version of any of the above testing algorithms. The test algorithms can be configured such that subsequent analysis of a potential fault can identify one or more of the following: stuck-at-fault (SAF), transition fault (TF), address-decoder fault (AF), stuck-open fault (SOF), coupling fault (CF) (that can include a state CF, an inversion CF, and/or a idempotent CF, intra-word CF, inter-word CF), disturb fault (DF) that can include a read DF, and/or a data retention fault (DRF) (e.g., due to SRAM or DRAM leakage and/or DRAM refresh fault). In some embodiments, depending on the type of pattern being used for the testing, the background pattern generator 156 can use a counter (e.g., binary, gray, etc.), a linear feedback shift register (LFSR), a look-up-table (LUT), programmable logic device (PLD), etc. In some embodiments, the test data patterns generated by the background pattern generator 136 can be bit-oriented and in other embodiments the data patterns can be word oriented.

Each of the output signals from the FSM 132, address generator 134, and background pattern generator 136 can be input to respective multiplexers 142, 144, 146, in the test collar 140. The multiplexers 142, 144, 146 can also respectively receive control, address, and data signals for normal operations on another input of each multiplexer. During the MBIST procedure on the memory array 155, the multiplexers 142, 144, 146 select the test signals from the memory array test circuit 130 (e.g., the output signals from the FSM 132, the address generator 134, and the background pattern generator 136) for output to the logic circuit of the memory device 150. During normal operation (e.g., normal read/write memory operations) of the memory device 150, the multiplexers 142, 144, 146 output the normal operation signals to the control logic of the memory device 150. In some embodiments, the multiplexers 142, 144, 146 can receive a signal from the MBIST controller 120 (and/or another controller or processor) indicating the initiation of an MBIST procedure so that the multiplexers 142, 144, 146 switch from outputting the normal operation signals to outputting the test signals of the memory array test circuit 130.

In some embodiments, during the MBIST procedure, the MBIST circuit 110 can include a comparator circuit 160 that checks the data pattern output from the memory device 150 against the test data pattern input to the memory device 150 from the background pattern generator 136. If the output data pattern from the memory device 150 matches the test data pattern output from the background pattern generator 136 for the tested memory location (or locations), the comparator 160 can output a pass signal for the memory location(s). If the output data pattern does not match the test data pattern for the tested address (or addresses), the comparator circuit 160 can output a fail signal for the memory location(s). In some embodiments, in response to the comparator 160 indicating a memory cell has a failure, the MBIST controller (and/or another controller or processor) can identify the corresponding address of the faulty memory location as defective so that the faulty memory cell is not used. In some embodiments, information regarding the failed memory location(s) can be stored (e.g., in controller memory 124 or another memory) for later analysis and/or possible repair. For example, in some embodiments, the comparator circuit 160 (and/or another circuit) can include the logic to determine the type of failure (e.g., SAF, TF, AF, SOF, CF, DF, and/or DRF) and logic to take appropriate actions.

When testing more than one memory array 155, in some embodiments, the testing can be done in series such that a new memory array is tested after completion of the testing on the previous memory array. In some embodiments, the testing of multiple memory arrays can be done in parallel. In this embodiment, the data patterns are transmitted in parallel to each of the memory arrays being tested and appropriate circuits (such as demultiplexers) can be used to separate the results of the testing.

Figure 2:
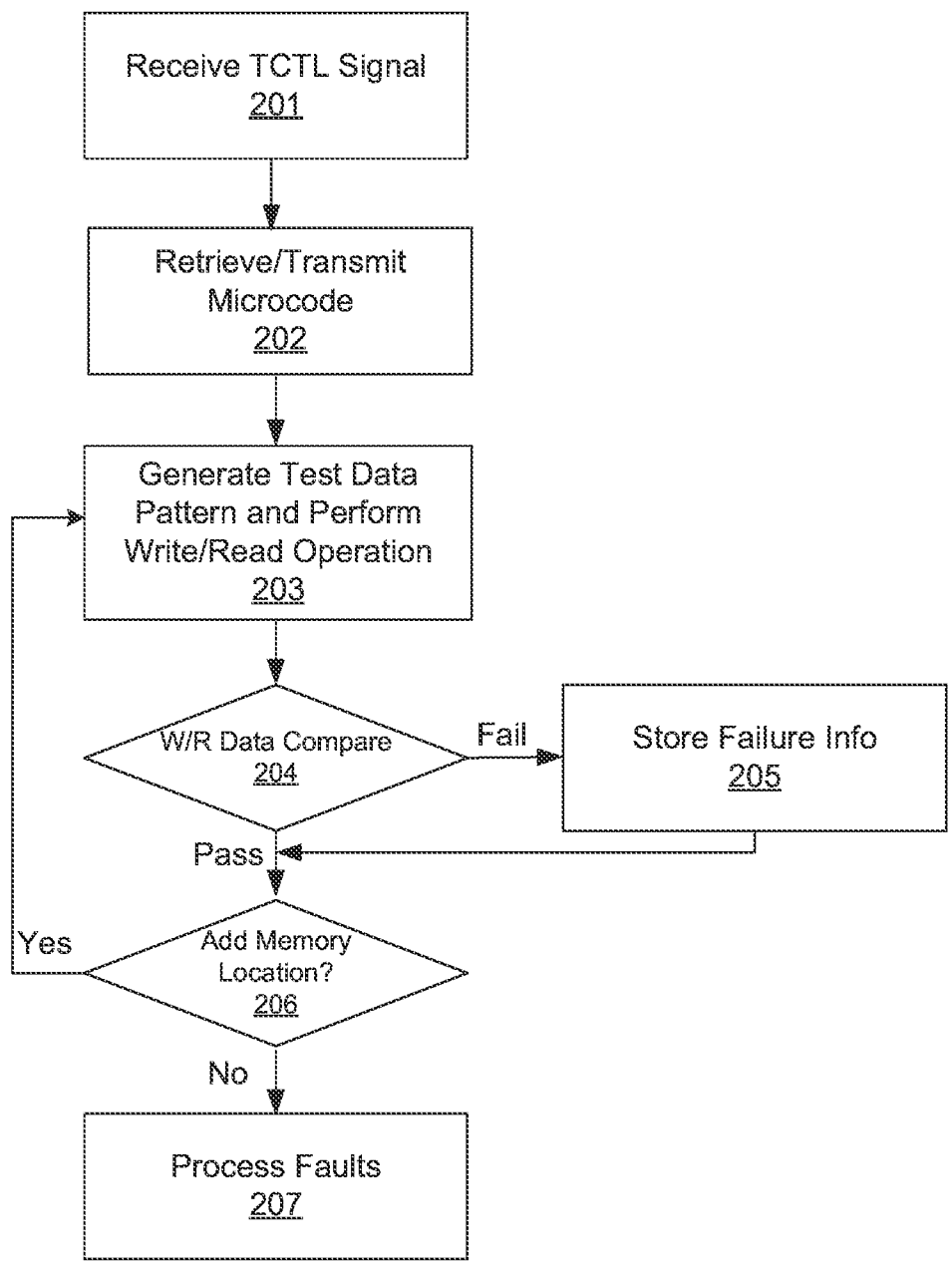
FIG. 2 illustrates a memory built-in self-test procedure that can be implemented by the memory built-in self-test circuit of FIG. 1.

FIG. 2 is a simplified flow diagram of an MBIST procedure performed by the MBIST circuit 110 in accordance with an embodiment of the present disclosure. The MBIST procedure can be performed before the memory device is shipped, as part of a power-on sequence when the memory device is turned on, periodically during normal operation of the memory device, based on a manual initiation (e.g., by an application or a user) to test the memory device, and/or based on an event such as, for example, high bit error counts. In an operation block 201, the MBIST controller 120 (and/or another controller or processor) can receive the test control (TCTL) signal from control logic internal to the memory device 150 (or an apparatus containing the memory device 150) and/or from an external source (e.g., a host computer, processor, etc.). The TCTL signal may include an instruction to start the MBIST procedure. In some embodiments, the TCTL signal can also include information concerning the address(es) of the memory location(s) to be tested, the type of test data pattern to use, and/or other information related to the MBIST procedure. In some embodiments, the MBIST procedure information, including the information related to the memory location address(es) and test data pattern can be stored in the MBIST controller 120. The test data pattern can be, for example, a predetermined test data pattern corresponding to one or more of the test data patterns discussed above.

In response to the TCTL signal, in operation block 202, the MBIST controller 120 (and/or another controller or processor) can retrieve the relevant microcode(s) from memory 124 (and/or another memory location) and transmit the appropriate commands to the FSM 132 of the memory array circuit 130. Based on the microcode(s), in operation block 203, the memory array test circuit 130 generates the test data pattern and, in the proper sequence, performs a write to/read from operation on the memory location(s) being tested. For example, the FSM 132, in combination with the address generator 134 and the background pattern generator 136, generates the requested test data pattern, selects the address(es) of the memory location(s) to be tested, and provides the control information to write the test data pattern to the selected memory location(s) and then read the written data from the selected memory location(s) after an appropriate pause time.

In operation block 204, the comparator 160 (and/or another controller or processor) can compare the test data pattern written to the selected memory location(s) with the data read from the selected memory location(s) to determine whether there is a memory cell fault. In some embodiments, if the test fails (e.g., there is a memory cell fault because the data read from the selected memory location(s) does not match the test data pattern), in operation block 205, information (e.g., the address) related to the faulty memory location is stored (e.g., stored in memory 124 and/or another memory location) for later analysis and/or repair. The operation then proceeds to block 206. If the test passes (e.g., there is no fault in the memory cell because the data read from the memory location(s) matches the test data pattern), the process immediately proceeds to operation block 206. At operation block 206, the FSM 132 (and/or another controller or processor) determines whether another memory location(s) needs to be tested. If yes, the operation goes back to block 203 to perform the generate and write/read operations discussed above for the new memory location(s). Once all memory locations are tested and the result in operation block 206 is a no, the operation proceeds to block 207. In operation block 207, in some embodiments, the MBIST controller 120 (and/or another controller or processor) processes the stored faults. For example, the identified faults can be processed such that the addresses of the memory cells that failed are not used and/or redundant memory cells are substituted for the failed memory cells. In addition, in some embodiments, further analysis of the type of memory failure can be performed and appropriate actions taken.

The faults identified by the MBIST controller 120 (and/or another controller or processor) can be based on hard bit-errors or soft bit-errors. That is, exemplary embodiments of the present disclosure can identify both hard bit-errors and soft bit-errors. Hard bit-errors in memory cells can occur due to physical defects in the memory cells or associated circuits. The hard bit-error can be immediately detected after the write operation by reading the memory cell. Thus, an MBIST circuit does not need a pause time to detect hard bit-error faults. However, an MBIST circuit that does not have a pause time between the write and read operations will only detect hard bit-errors, which may only account for approximately 60% of the memory cell errors. An MBIST circuit with no pause time does not detect soft bit-errors because soft bit-errors may not be immediately detectable after a write operation. For example, if the charge leakage rate of a memory cell is excessive (e.g., data retention time is too short) but the charge is still maintained for a short period of time, an immediate reading of the memory cell may not detect the fault and the fault will go undetected. The undetected fault can become a problem because the data in a memory cell can get corrupted if the data retention time of a memory cell is shorter than the memory refresh time during normal memory operation. Refresh times in a memory device during normal operation can vary based on temperature of the memory device. Accordingly, a memory cell fault in which the data retention time is shorter than the fastest refresh rate will go undetected if an MBIST circuit has no pause time.

To capture soft bit-error rates such as data retention faults, some conventional MBIST circuits have fixed pause times. However, the fixed pause times also have problems in that the MBIST circuits can capture too many false soft bit-error faults or still miss too many actual soft bit-errors. For example, an MBIST circuit that uses a fixed pause time that is relatively long can detect most soft bit-errors but can also pick up too many false soft bit-errors. A false soft bit-error can occur when the pause time of the MBIST circuit is longer than the data retention time on an otherwise good memory cell. This can occur if the MBIST procedure is performed at a high temperature and the fixed pause time is too long. In addition, the relatively long pause time leads to inefficiencies such as longer than necessary test times and/or test times that may not meet JEDEC specifications. Further, in order to stay within the test time limits, a long fixed pause time can mean that only simple data test patterns can be used instead of more complex test data patterns that can pick up other faults. Conversely, although a short fixed pause time will pick up some soft bit-errors while minimizing the detection of false soft bit-error faults, the short fixed pause time may not detect actual soft bit-errors when the MBIST procedure is performed at a low temperature. This is because a pause time that is too short will not provide enough time for the charge in an otherwise bad memory cell to leak out when the device is at a cooler temperature. Accordingly, a pause time that is short can lead to undetected faults.

In exemplary embodiments of the present disclosure, the pause time is adjustable to take into account testing at different device conditions (e.g., testing at different temperatures). In some embodiments, the pause time can be manually adjusted. However, in other embodiments, the pause time can be automatically adjusted based on memory device conditions that can affect memory cell characteristics (e.g., data retention time of memory cell being tested). For example, in some embodiments, the length of the pause time can be based on the temperature of the memory device. By adjusting the length of the pause time setting for the MBIST circuit, the pause time setting more closely matches the typical time period for an actual soft bit-error should it occur. For example, for a data retention error, the pause time setting is shortened as the temperature increases to take into account the shorter data retention times for even good memory cells and the pause time setting is extended to take into account that the fact that even a bad memory cell will retain its charge longer when cooler. By adjusting the length of the pause time (e.g., based on temperature), exemplary embodiments of the present disclosure can detect 80% to 90% of the actual memory faults (both hard bit-errors and soft bit-errors) while minimizing the detection of false faults.

Figure 3:
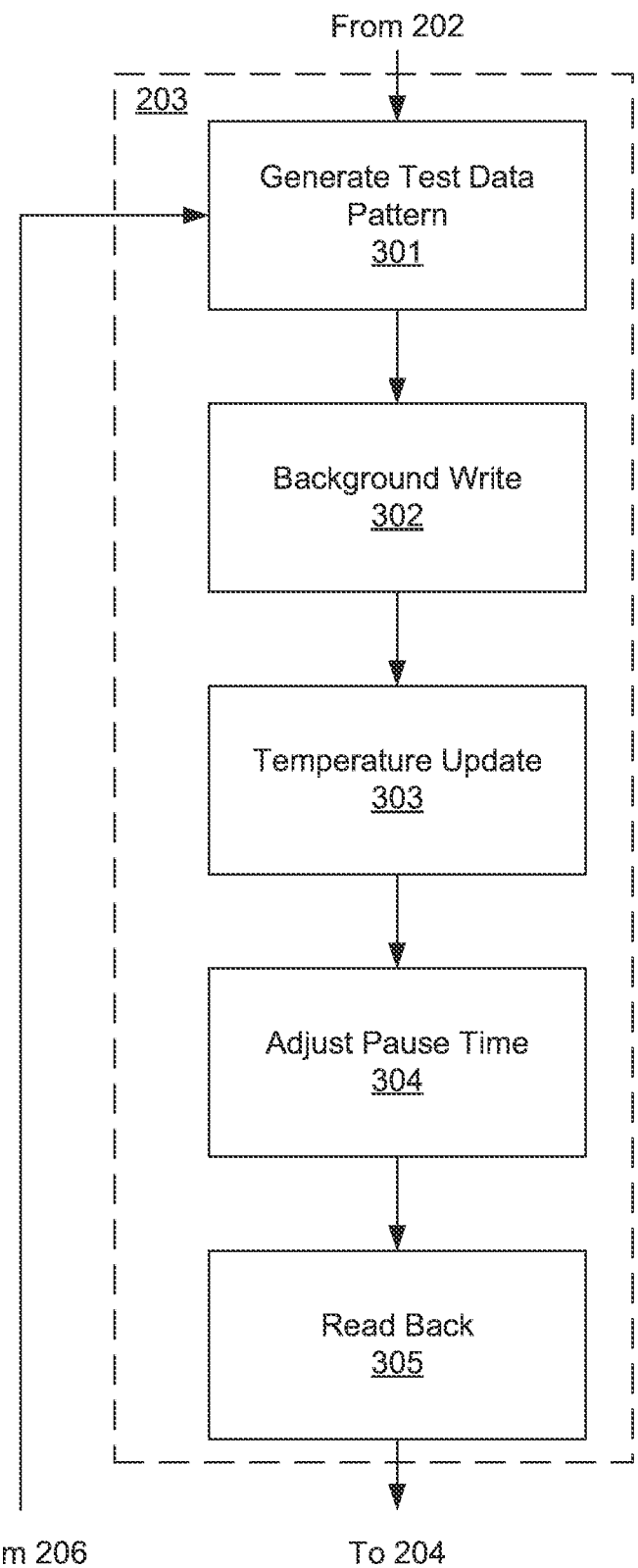
FIG. 3 illustrates a test pattern sequence procedure that can be incorporated in the built-in self-test procedure of FIG. 2.

FIG. 3 illustrates a more detailed test data pattern generation and write/read operation sequence in accordance with an embodiment of the present disclosure. As seen in FIG. 3, the operation block 203 can include sub-operation blocks, as identified by blocks 301-305. In block 301, the test data pattern is generated by, for example, background pattern generator 136. In block, 302, the generated test data pattern is written (also referred to as "background write" in the art) to selected memory location(s) (e.g., memory location(s) selected by the address generator 134 based on control signals from FSM 132). Depending on the configuration of the MBIST circuit 110, the test data pattern can be written to the entire memory array or a subset of the memory array such as one or more planes, one or more pages, one or more blocks, and/or one or more lines. In block 303, an updated temperature sensor (TS) code is read from, for example, a memory register that stores the TS code. In some embodiments, the TS code in the memory register corresponds to a temperature of the memory cell(s) being tested in the memory array 155. In exemplary embodiments of the present disclosure, the TS code is updated after each write operation in order to take into account every potential temperature change during the MBIST procedure. However, in other embodiments, the updating of the TS code can be done only once per MBIST procedure (e.g., at the beginning or at some other point during the MBIST procedure). In still other embodiments, the TS code can be updated only after the temperature changes a predetermined amount (e.g., a predetermined deadband) to minimize processing time. In some embodiments, the updated TS code can be read directly from the temperature sensor instead of reading the code from a register. Depending on the configuration of the MBIST circuit 110, the temperature sensor measures a temperature of the apparatus (e.g., a temperature of the memory device 150, a temperature of a semiconductor die in the memory device 150, and/or a temperature of the memory array 155) such that the measured temperature (and thus the TS code) corresponds to a temperature of the memory cell(s) being tested. For example, in some embodiments, a temperature sensor reading a current temperature of the semiconductor die in the memory device 150 can be used. After receiving the TS code, the operation proceeds to block 304 where the pause time is adjusted based on the updated TS code. As discussed above, a pause time greater than zero between the writing of the test data and the reading of the test data allows for detection of soft bit-errors in addition to hard bit-errors. After the pause time has expired, the operation proceeds to block 305 where the memory locations that were written in block 301 will be read back. After the memory locations have been read back, the operation proceeds to block 204 of FIG. 2, which is discussed above.

Figure 4A:
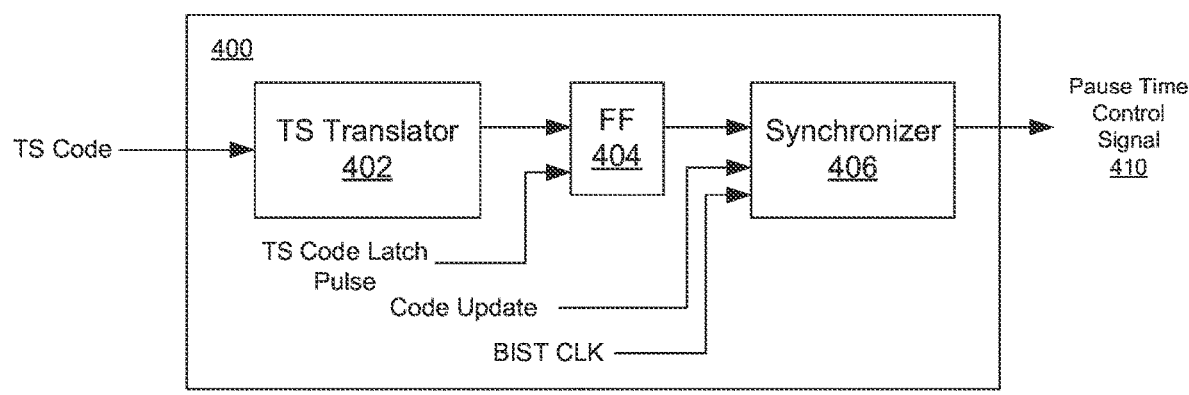
FIG. 4A illustrates a temperature sensor code to loop count converter circuit that is in accordance with the present disclosure.

FIG. 4A illustrates a functional block diagram for adjusting the pause time in accordance with an embodiment of the present disclosure. As seen in FIG. 4A, a pause time update circuit 400 includes TS translator 402. The TS translator 402 receives a TS code from, for example, the appropriate memory register. In some embodiments, the TS code is a 4-bit code corresponding to the temperature of, for example, a semiconductor die of the memory device 150. In some embodiments, the TS translator 402 converts the TS code to a loop count corresponding to the number of cycles of the BIST clock. In some embodiments, the loop count signal can be a 6-bit value. The loop count signal is then output to a flip-flop latch circuit 404 that holds the updated loop count value until the next update is performed. In some embodiments, the flip-flop latch circuit 404 can be controlled with a TS code latch pulse from the temperature sensor circuit (not shown). The TS code latch pulse can indicate when the TS code has been updated so that the flip-flop latch circuit 404 then outputs the updated loop count signal. The TS code can be updated periodically, based on a change in temperature above a predetermined deadband, based on a signal from the BIST controller 120 (and/or another controller or processor), based on a signal from an external source (e.g., a host processor), based on operations occurring in the memory device 150, and/or based on other some other criteria. The updated loop count signal output from the flip-flop latch circuit 404 is sent to a synchronizer circuit 406 that synchronizes the updated loop count signal to the BIST clock signal before outputting the updated loop count signal as pause time control signal 410. For example, in some embodiments, when the state of the controller is at block 303, a code update signal into the synchronizer circuit 406 triggers a capture of the loop count signal from the flip-flop latch circuit 404 synchronized with the BIST clock signal. After the synchronizer circuit 406 captures the updated loop count signal, the updated value is held until next "update" is triggered in the next loop corresponding to, for example, the loop from block 206. Thus, in embodiments of the present disclosure, the loop count signal is captured/updated at every pause for each loop at block 304. As discussed further below, the pause time control signal 410 is used as the pause time setting for the pause time counter 450.

In some embodiments, the loop count corresponds to a pause time setting as follows: pause time setting=BIST clock rate*loop count. The pause time setting in some embodiments can be in a range from 0 ms to 25 ms. A value of 0 ms can mean that the read operation immediately follows the write operation. That is, the pause time circuit is bypassed or the pause time setting value is so small as to be negligible. With a 0 ms setting value, the MBIST procedure will only pick up hard bit-errors. In some embodiments, the TS translator 402 can include a data structure to correlate a temperature of the memory cell(s) being tested to a pause time setting. For example, the data structure can be a look-up-table (LUT) to correlate (e.g., convert) the TS code to a loop count. In some embodiments, the controller memory 124 (or another memory location) can include one or more TS code to loop count LUTs that can be selected by the TS translator 402. In some embodiments, the TS code to loop count LUTs can correspond to different sensitivities with respect to identifying soft bit-errors during an MBIST procedure. For example, Table 1 includes two options, LUT1 and LUT2, for TS code to loop count LUTs that can be selected by the TS translator 402. LUT2 is more sensitive to detecting soft bit-errors than LUT1 but LUT1 is less likely to detect false faults than LUT2. For clarity in understanding, the pause time setting in ms is given in Table 1 rather than the number of loops.

TABLE 1

| Internal Temperature | LUT1 | LUT2 |
|---|---|---|
| Temp >= 115° C. | 0 ms | 2 ms |
| 115° C. > Temp >= 90° C. | 2 ms | 4 ms |
| 90° C. > Temp >= 56° C. | 4 ms | 8 ms |
| 56° C. > Temp | 8 ms | 16 ms |

In each of the above LUTs, the pause time setting can be configured such that, as the internal temperature gets hotter, the pause time setting gets shorter so that, ideally, a read operation occurs before the memory cell charge leaks in otherwise good memory cells. Conversely, as the internal temperature gets cooler, the pause time setting gets longer so that, ideally, the read operation occurs after the memory cell charge in a faulty memory cell has leaked but before the memory cell charge in a good memory cell leaks. In the embodiments of Table 1, the records in the LUTs correspond to an operating temperature range of the memory device 150 with each record corresponding to a sub-range of the operating temperature. The LUT fields for each record correlate the internal temperature of the memory device (e.g., corresponding to the memory cell(s) temperature) to a predetermined pause time setting. That is, the operating temperature range is split into sub-ranges (e.g., four sub-ranges in Table 1) with each sub-range having a predetermined pause time setting. Exemplary embodiments of the present disclosure are not limited to four sub-ranges and can include any practical number of sub-ranges. For example, the number of records (sub-ranges) in an LUT can depending on a desired balance between precision and efficiency, and the pause time setting for each record can depend on a desired balance between detecting too many false faults and missing too many actual faults.

In some embodiments, when more than one LUT is initially available, the BIST circuit 110 is configured to only select one LUT via a fuse option. That is, once a LUT is selected, the MBIST circuit is hard-wired to the selected LUT and not resettable. The selection of the LUT can occur during, for example, factory configuration of the memory device 150. In other embodiments, the customer can implement the fuse option to select an LUT based on the desired operation of the memory device after the device has been shipped form the factory. In some embodiments, the fuse option can select between an LUT or a fixed or no pause time option. In still other embodiments, a command can be assigned that selects an appropriate LUT whenever the BIST operation is initiated. In some embodiments, the LUTs can include pause time values that directly correspond to time (e.g., corresponding to ms) rather than loop counts. In some embodiments, the TS code to loop count conversion can be based on an algorithm (e.g., a linear or non-linear formula) rather than LUTs. In some embodiments, a data structure other than an LUT can be used.

Figure 4B:
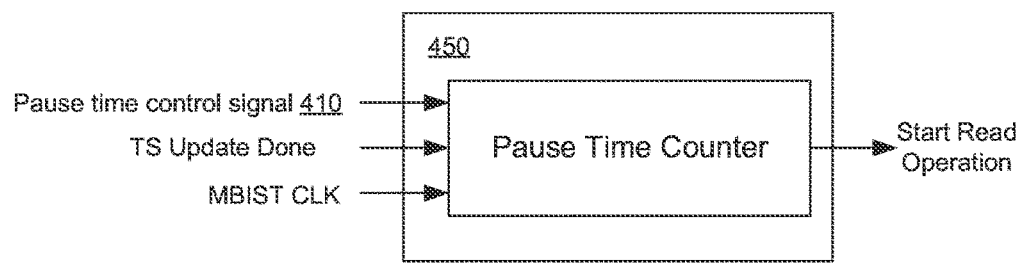
FIG. 4B illustrates a pause time counter circuit that is in accordance with the present disclosure.

As seen in FIG. 4B, the pause time control signal 410 from the pause time update circuit 400 is received by the pause time counter circuit 450. The pause time counter circuit 450 also receives a state signal (e.g., a TS update done signal), indicating whether the TS update operation is done (e.g., from block 303), and the MBIST clock signal. The TS update done signal may trigger the pause time counter circuit 450 loop count. Based on the pause time setting corresponding the pause time control signal 410, the pause time counter circuit 450 counts the MBIST clock pulses until the counter value matches the pause time setting. When the counter value matches the pause time setting, the pause time counter circuit 450 outputs a state signal to start the read operation.

In the above embodiments, the pause time is adjusted based on the temperature sensor. However, the pause time can be adjusted based on other memory device conditions that can affect memory cell characteristics (e.g., data retention times in memory cells). For example, the memory device conditions can include factors such as, for example, number of operations on the memory device (e.g., operations on the memory array, memory cell, etc.), age of the memory device, bit error rate, or some other criteria that can affect memory cell characteristics. In some embodiments, one or more data structures (e.g., LUTs) can be configured to provide adjustments to the pause time that reflect one or more memory device conditions (e.g., temperature, number of operations, age, bit error rate, etc.).

A processing device can represent one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. A processing device can also be one or more special-purpose processing devices such as an application specific integrated circuit (ASIC), a field programmable gate array (FPGA), a digital signal processor (DSP), network processor, or the like. The processing device (e.g., processor 122, controller 132 and/or another controller) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory 124, memory device 150, or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
a memory array; and
a memory built-in self-test (MBIST) circuit to test the memory array, the MBIST circuit including one or more processing devices, to:
write a data pattern to one or more memory cells to be tested in the memory array,
pause for a time period corresponding to a predetermined pause time setting, and
read the written data pattern from the one or more memory cells after the time period has elapsed,
wherein the predetermined pause time setting is automatically adjusted based on memory device conditions.

2. The apparatus of claim 1, wherein the memory device conditions correspond to a temperature of the one or more memory cells being tested,
wherein the predetermined pause time setting is automatically adjusted based on a temperature sensor code corresponding to the temperature of the one or more memory cells being tested, and
wherein the temperature sensor code is updated prior to the adjusting of the predetermined pause time setting.

3. The apparatus of claim 2, wherein the updating of the temperature sensor code is performed after each writing of the data pattern and before the corresponding reading of the written data pattern.

4. The apparatus of claim 2, wherein the adjusting of the predetermined pause time setting is based on a data structure that correlates the temperature sensor code to a corresponding pause time.

5. The apparatus of claim 4, wherein the data structure is a look-up-table that is configured such that, as the temperature sensor code gets hotter, the corresponding pause time gets shorter.

6. The apparatus of claim 1, wherein the one or more processing devices determine whether the one or more memory cells have a fault based on a comparison between the data pattern written to the one or more memory cells and the written data pattern read from the one or more memory cells.

7. The apparatus of claim 6, wherein the one or more processors are configured to detect a data retention fault.

8. A method, comprising:
writing a data pattern to one or more memory cells in a memory array to be tested;
automatically adjusting a predetermined pause time setting;
pausing for a time period corresponding to the predetermined pause time setting; and
reading the written data pattern from the one or more memory cells after the time period has elapsed.

9. The method of claim 8, wherein the automatically adjusting the predetermined pause time setting is based on a temperature sensor code corresponding to a temperature of the one or more memory cells being tested,
the method further comprising:
updating the temperature sensor code prior to the adjusting of the predetermined pause time setting.

10. The method of claim 9, wherein the updating of the temperature sensor code is performed after each writing of the data pattern and before the corresponding reading of the written data pattern.

11. The method of claim 9, wherein the automatically adjusting the predetermined pause time setting comprises correlating the temperature sensor code to a corresponding pause time.

12. The method of claim 11, wherein the correlating is such that, as the temperature sensor code gets hotter, the corresponding pause time gets shorter.

13. The method of claim 8, further comprising:
determining whether the one or more memory cells have a fault based on a comparison between the data pattern written to the one or more memory cells and the written data pattern read from the one or more memory cells.

14. The method of claim 13, wherein the determining includes determining that a detect fault is a data retention fault.

15. A non-transitory computer-readable storage medium comprising instructions that, when executed by a processing device, cause the processing device to:
write a data pattern to one or more memory cells in a memory array to be tested;
automatically adjust a predetermined pause time setting;
pause for a time period corresponding to the predetermined pause time setting; and
read the written data pattern from the one or more memory cells after the time period has elapsed.

16. The non-transitory computer-readable storage medium of claim 15, wherein the automatically adjusting the predetermined pause time setting is based on a temperature sensor code corresponding to a temperature of the one or more memory cells being tested; and wherein the instructions further cause the processing device to update the temperature sensor code prior to the adjusting of the predetermined pause time setting.

17. The non-transitory computer-readable storage medium of claim 16, wherein the updating of the temperature sensor code is performed after each writing of the data pattern and before the corresponding reading of the written data pattern.

18. The non-transitory computer-readable storage medium of claim 15, wherein the automatically adjusting the predetermined pause time setting comprises correlating the temperature sensor code to a corresponding pause time.

19. The non-transitory computer-readable storage medium of claim 18, wherein the correlating is such that, as the temperature sensor code gets hotter, the corresponding pause time gets shorter.

20. The non-transitory computer-readable storage medium of claim 15, the instructions further causing the processing device to:

determine whether the one or more memory cells have a fault based on a comparison between the data pattern written to the one or more memory cells and the written data pattern read from the one or more memory cells, wherein the determining includes determining that a detect fault is a data retention fault.

\* \* \* \* \*